United States Patent [19]
Vollmayr

[11] Patent Number: 4,534,004
[45] Date of Patent: Aug. 6, 1985

[54] APPARATUS AND METHOD FOR DETERMINING SIGNAL PARAMETERS OF PERIODIC SQUARE WAVE SIGNALS

[75] Inventor: Norbert Vollmayr, Traunwalchen, Fed. Rep. of Germany

[73] Assignee: Johannes Heidenhain GmbH, Traunreut, Fed. Rep. of Germany

[21] Appl. No.: 380,272

[22] Filed: May 20, 1982

[30] Foreign Application Priority Data

Jun. 6, 1981 [DE] Fed. Rep. of Germany ....... 3122702

[51] Int. Cl.$^3$ ............................................. G01R 29/02
[52] U.S. Cl. ................................... 364/486; 328/133; 364/481
[58] Field of Search ............... 364/481, 486, 487, 572, 364/724; 307/471, 262; 328/109, 130.1, 133, 140; 375/25

[56] References Cited

U.S. PATENT DOCUMENTS

| | | | |
|---|---|---|---|
| 3,502,904 | 3/1970 | Bordonaro | 328/140 X |
| 4,020,422 | 4/1977 | Underhill | 328/133 |
| 4,155,116 | 5/1979 | Tawfik et al. | 364/579 X |
| 4,197,508 | 4/1980 | Takaoka | 328/140 |
| 4,225,931 | 9/1980 | Schwefel | 364/577 |
| 4,242,732 | 12/1980 | Campbell | 364/572 X |
| 4,276,605 | 6/1981 | Okamoto et al. | 364/481 X |
| 4,319,329 | 3/1982 | Grigis et al. | 364/484 |

Primary Examiner—Errol A. Krass
Assistant Examiner—Edward Cosimano
Attorney, Agent, or Firm—Willian Brinks Olds Hofer Gilson & Lione Ltd.

[57] ABSTRACT

A method and apparatus for determining the phase angle between two periodic square wave signals is disclosed in which the two square wave signals are applied to respective inputs of an exclusive OR gate, the output signal of which is applied to a first input of a digital selection circuit. The output signal generated by this digital selection circuit is passed through a low pass filter to form a time integral, arithmetic mean value which is digitized by an analog to digital converter and supplied as a numerical value to a digital computer. The digital computer applies logical signals to two additional inputs of the digital selection circuit. The computer is programmed to sequentially set these control signals such that the digital signal presented to the computer sequentially represents the mean value, an upper signal level value, and a lower signal level value of the square wave signal output by the selection circuit. The computer is programmed to use these three variables to calculate a corrected value of the phase angle and to display this calculated value on a display unit.

13 Claims, 23 Drawing Figures

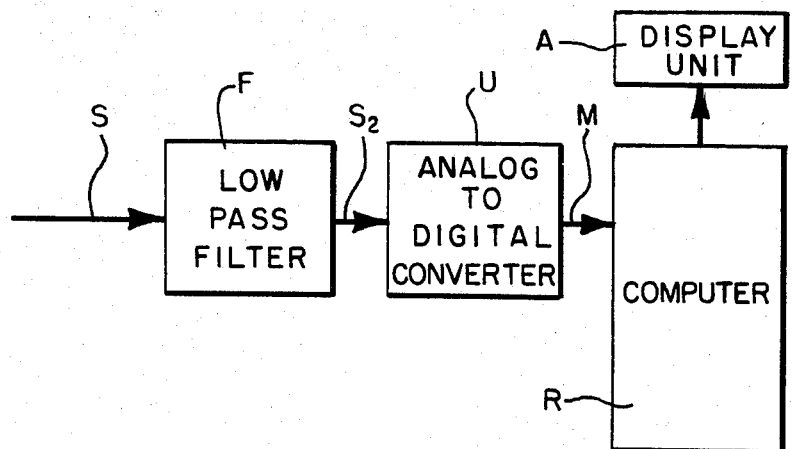
FIG. 1
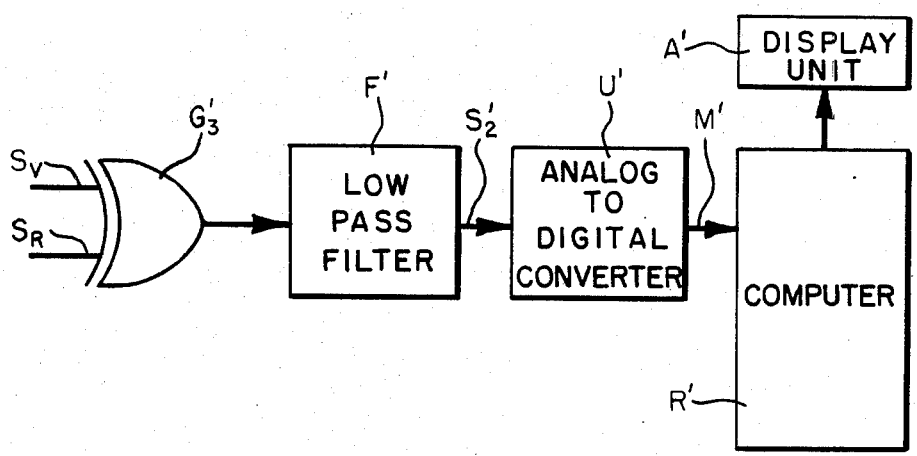
FIG. 2
| $P_1$ | $P_2$ | B |
|---|---|---|
| 0 | 0 | $SU_1$ |
| 1 | 0 | $SU_1$ |
| 0 | 1 | $S_1$ |
| 1 | 1 | $SO_1$ |
FIG. 7
| $P_1'$ | $P_2'$ | B' |
|---|---|---|
| 0 | 0 | $SU_1'$ |
| 1 | 0 | $SU_1'$ |
| 0 | 1 | $S_1'$ |
| 1 | 1 | $SO_1'$ |
FIG. 8

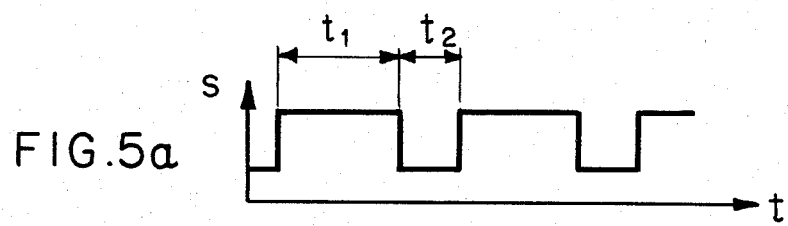
FIG.5a
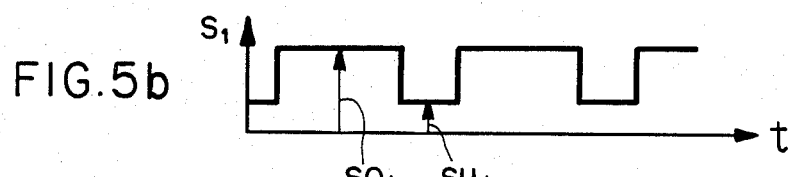
FIG.5b    $P_1 = 0$
          $P_2 = 1$
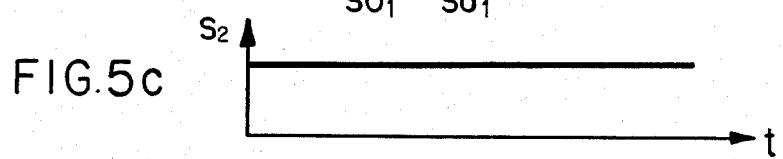
FIG.5c
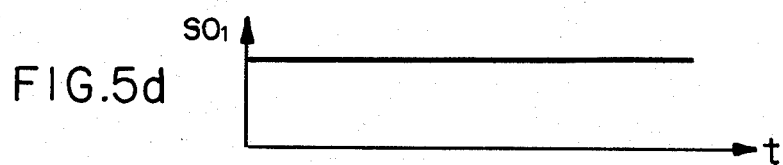
FIG.5d    $P_1 = 1$
          $P_2 = 1$
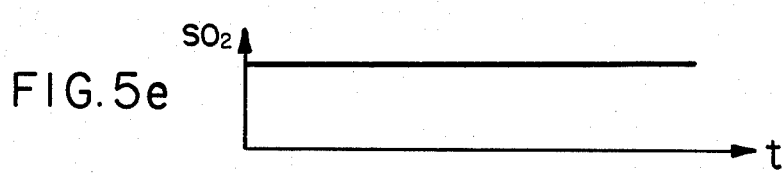
FIG.5e
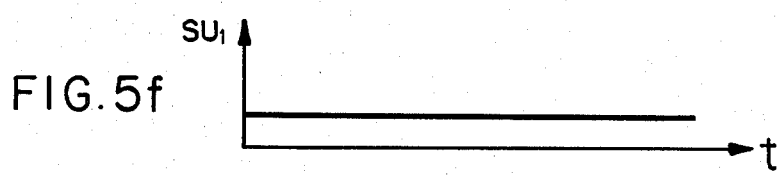
FIG.5f    $P_1 = 0$
          $P_2 = 0$
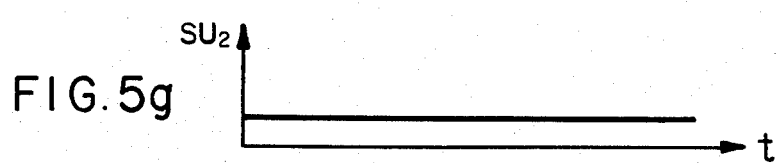
FIG.5g

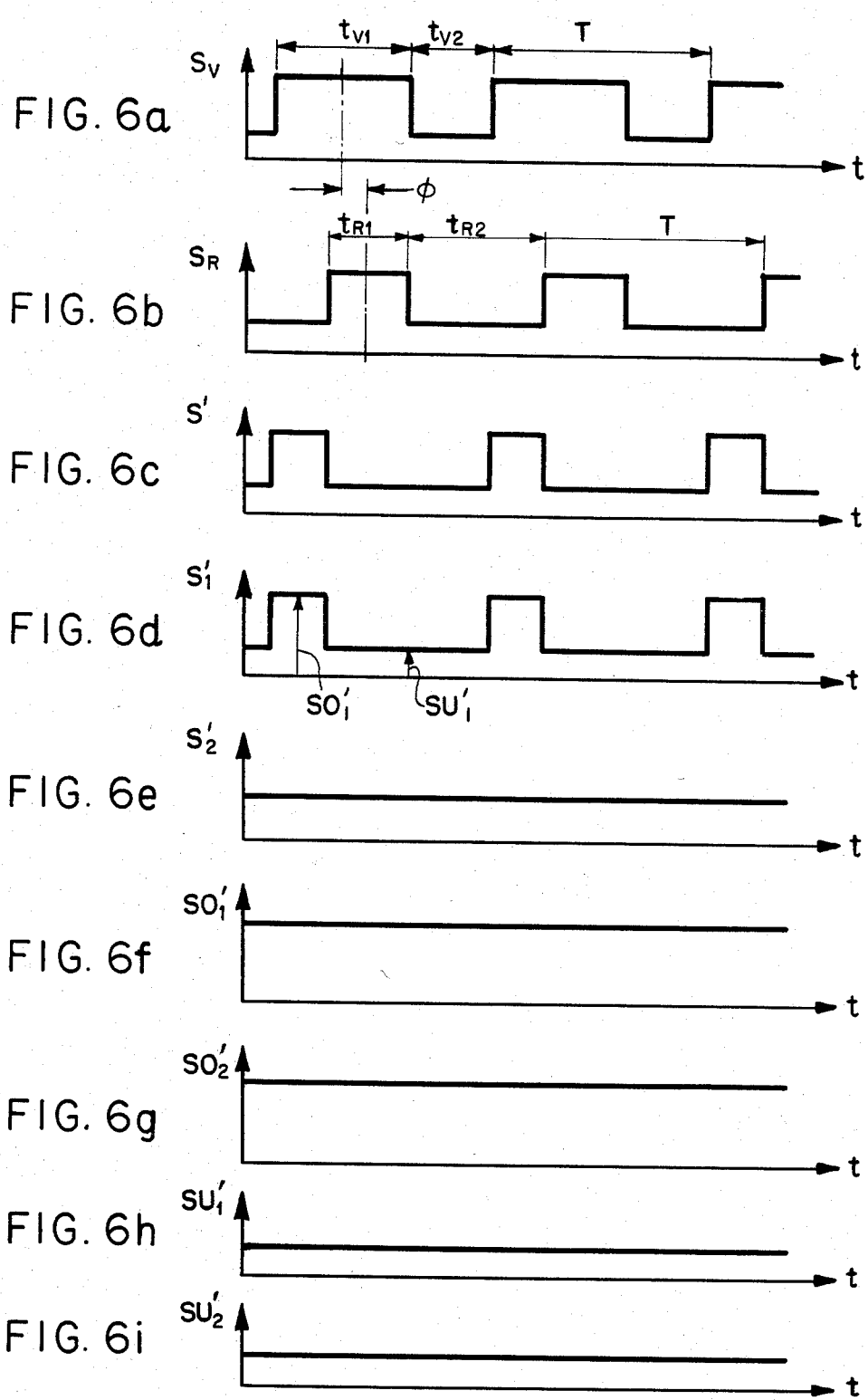

APPARATUS AND METHOD FOR DETERMINING SIGNAL PARAMETERS OF PERIODIC SQUARE WAVE SIGNALS

BACKGROUND OF THE INVENTION

This invention relates to an improved apparatus and method for determining signal parameters such as the pulse width repetition ratio and the phase angle of periodic square wave signals.

German Pat. No. 11 79 634 discloses an apparatus and process for detecting and determining the phase angle between two alternating currents or alternating voltages. In the disclosed apparatus two square wave signals, each having equal pulse width repetition ratios, are applied to a logical gate circuit which acts to produce at its ouputs a square wave signal. The time averaged value of this square wave signal is proportional to the magnitude of the phase angle. A measuring instrument of the type which is sensitive to current polarity and has a scale with the zero position at the center of the scale can be coupled to the outputs of the gate circuit so that the magnitude and polarity of the phase angle can be displayed directly. In this prior art approach, an indicator such as a pointer is used to provide an analog display of the phase angle. Such an analog display is limited in accuracy; moreover, reading inaccuracies are increased at low frequencies of the square wave signals due to hunting and oscillation of the indicator. In addition, the voltage levels of the two output gates of the gate circuit must correspond with one another closely in magnitude. In order to achieve this correspondence, it is customary to balance the gate circuit. This balancing is not only difficult and time-consuming to achieve, but it also must be repeated from time to time to insure the accuracy of the system.

SUMMARY OF THE INVENTION

The present invention is directed to an improved apparatus and method for determining signal parameters of the type described above, which overcome or reduce the disadvantages of the known approaches. The apparatus of this invention can be constructed with simple circuits to permit an accurate determination of signal parameters which can be easily read or used as inputs to digital processing devices. The preferred embodiments of this invention are particularly well adapted for use in conjunction with digital electrical position measuring devices.

According to this invention, means are provided for generating a time integral, arithmetic mean, analog signal in response to at least one square wave signal such that the value of this analog signal corresponds to the desired signal parameter. Means are provided for generating a digital signal in response to the analog signal, which digital signal is applied as an input to a digital computer. This digital computer comprises means for determining the signal parameter of the square wave signal in response to the digital signal.

Preferably, the invention also comprises a digital section circuit controllable by the computer. The computer is programmed to control the digital selection circuit such that the computer can sample and obtain a digital measure of the logic high and logic low levels of the square wave signal. These measurements can then be used to correct the determined signal parameter for variations in the logic high and logic low levels. In this way the accuracy and stability of the circuit of this invention is improved.

The present invention provides a number of important advantages. First, this invention permits a highly accurate determination of selected signal parameters, such as the pulse width repetition ratio or the phase angle of a square wave signal. The preferred apparatus and method described below in conjunction with FIGS. 3 and 4 make possible an exact determination of these signal parameters without requiring any balancing of the voltage levels of the component logical gates of the system. Furthermore, the phase angle between two square wave signals can be determined precisely even with differing pulse width repetition ratios.

The preferred embodiment of the apparatus and method of this invention are simple in construction and can be easily integrated into digital electric position measuring systems utilizing components already included in such systems. Such a digital electric position measuring system is described, for example, in West German OS No. 27 29 697. This document discloses a digital computer coupled to a display unit, and the disclosure of this document can be drawn on further to elucidate the structure of the examples described below.

Further advantageous features of the apparatus and method of this invention are set forth in the dependent claims attached hereto. The invention itself, together with further objects and attendant advantages, will best be understood by reference to the following detailed description taken in conjunction with the accompanying drawings.

BRIEF DESCRIPTION OF THE DRAWINGS

FIG. 1 is a schematic circuit diagram of a first preferred embodiment of this invention which operates to determine the pulse width repetition ratio of a square wave signal.

FIG. 2 is a schematic circuit diagram of a second preferred embodiment of this invention which operates to determine the phase angle between two periodic square wave signals.

FIGS. 5a through 5g are wave form diagrams of respective signals generated by the preferred embodiment of FIG. 3.

FIGS. 6a through 6i are wave form diagrams of respective signals generated by the preferred embodiment of FIG. 4.

FIG. 7 is a logical function table which sets out the function of control signals $P_1$ and $P_2$ of the embodiment of FIG. 3.

FIG. 8 is a logical function table which sets out the function of control signals $P'_1$ and $P'_2$ of the preferred embodiment of FIG. 4.

DETAILED DESCRIPTION OF THE PRESENTLY PREFERRED EMBODIMENTS

Turning now to FIG. 1, a square wave signal S, having a pulse width repetition ratio to be measured is supplied as an input signal to a low pass filter F. This low pass filter F acts to generate an output signal $S_2$ on an output terminal, which signal corresponds to a time integral, arithmetic mean value of the square wave signal S. The signal $S_2$ is applied to an analog to digital converter U which acts to generate a digital signal M which is applied to a digital computer R. The computer R is coupled to a display unit A, and the computer R is programmed to display the numerical value M generated by the converter U. This digital value M is representative of the pulse width repetition of the input square wave signal S.

The phase angle $\phi$ between two square wave signals $S_V$, $S_R$ is determined by the circuit of FIG. 2. The two square wave signals $S_V$, $S_R$ are applied as inputs to an exclusive OR gate $G'_3$, the output of which is coupled to the input of a low pass filter F'. The low pass filter F' acts to generate a time integral, arithmetic mean value $S'_2$ which is digitized by an analog to digital converter U' to form a numerical value M' which is applied as an input to a digital computer R'. The digital computer R' is programmed to calculate the phase angle $\phi$ by multiplying the digital value M' by the constant $\pi$. The calculated phase angle $\phi$ is displayed on the display unit A'.

Figure 3:
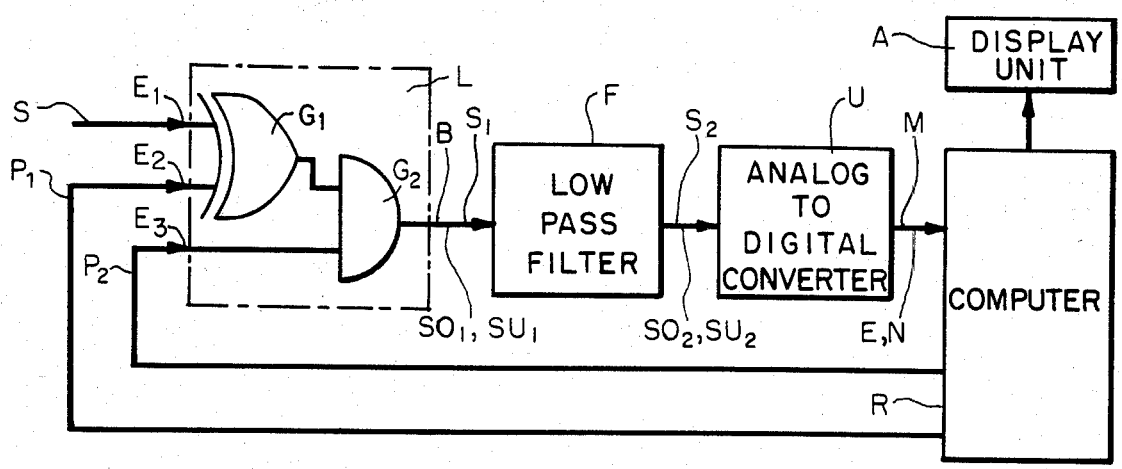
FIG. 3 is a schematic circuit diagram of a third preferred embodiment of this invention which operates to determine the pulse width repetition ratio of a square wave signal.
Figure 4:
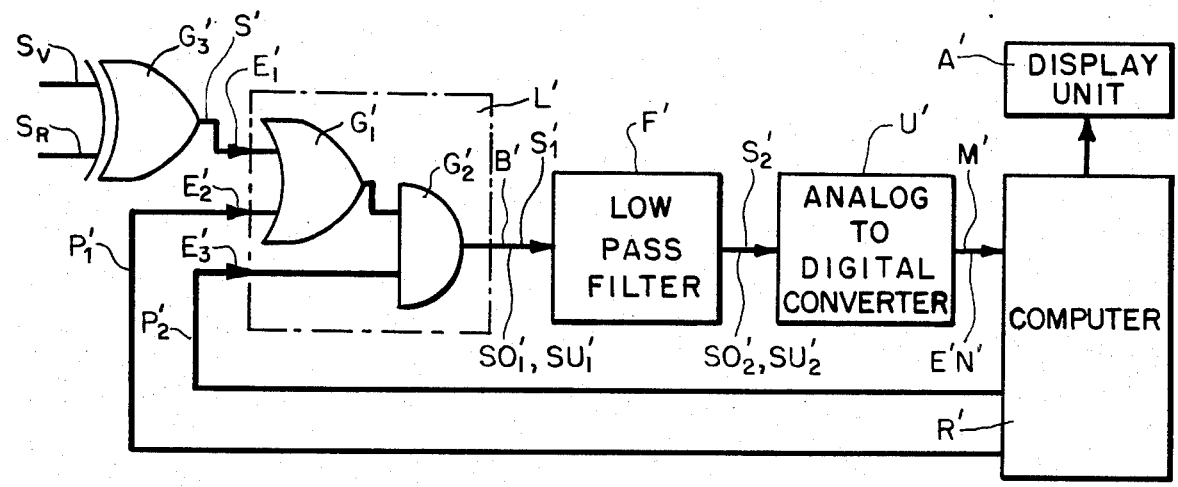
FIG. 4 is a schematic circuit diagram of a fourth preferred embodiment of this invention which operates to determine the phase angle between two square wave signals.

FIGS. 3 and 4 disclose further embodiments of this invention which incorporate further features and advantages.

As shown in FIG. 3, a square wave signal S having a pulse width repetition ratio TV to be measured is applied to one input $E_1$ of a digital selection circuit L. The output signal B from this digital selection circuit L is filtered by a low pass filter F and then digitized by means of an analog to digital converter U. The digitized output of the converter U is applied as an input to a digital computer R. This computer R is coupled to a display unit A and is programmed to generate digital control signals $P_1$, $P_2$ which are applied to input terminals $E_2$, $E_3$, respectively, of the digital selection circuit L.

The digital selection circuit L includes an OR gate $G_1$ having inputs $E_1$, $E_2$ and an output which is coupled to an AND gate $G_2$. The other input of the AND gate $G_2$ forms the third input $E_3$ of the digital selection circuit L. The output of the AND gate $G_2$ is connected to the low pass filter F. Preferably, the limit frequency of the low pass filter F lies far below the frequency of the square wave signal S.

In FIGS. 5a through 5g there are plotted the wave forms generated at various points in the circuit of FIG. 3 as a function of time t. FIG. 5a represents the square wave signal S having a pulse width repetition ratio TV which equals $t_1/t_2$. This signal S is applied to the input $E_1$ of the digital selection circuit. The square wave signal S appears as square wave signal $S_1$ of FIG. 5b on the output B of the digital selection circuit L if the control signal $P_1$ applied to the input terminal $E_2$ is in the logical low state and the control signal $P_2$ on the input terminal $E_3$ is in the logic high state. As explained previously, these control signals $P_1$, $P_2$ are generated by the digital computer R. The low pass filter F generates a time integral, arithmetic mean value $S_2$ from the square wave signal $S_1$. This signal $S_2$ is digitized by the analog to digital converter U and stored by the digital computer R as a binary numerical value M corresponding to the time integral, arithmetic mean value $S_2$.

Since the lower signal level $SU_1$ of the square wave signal $S_1$ is greater than zero (see FIG. 5b), the upper signal level $SO_1$ (logic high of the square wave signal $S_1$) and the lower signal level $SU_1$ (logic low of the square wave signal $S_1$) must be determined in order to permit exact determination of the pulse width repetition ratio TV. In order to determine the upper signal level $SO_1$, the digital computer R sets the control signal $P_1$ equal to one (logic high), thereby applying a logic high control signal to the input $E_2$ of the digital selection circuit L. In addition, the computer is programmed to set the control signal $P_2$ equal to one (logic high) such that a logic high signal is applied to the input $E_3$ of the selection circuit L. As previously explained, the square wave signal S is applied to the input $E_1$. When the two control signals $P_1$, $P_2$ are set as indicated above, the output B of the digital selection circuit L corresponds to the upper signal level $SO_1$ of the square wave signal $S_1$.

In order to determine the lower signal level $SU_1$ of the square wave signal $S_1$, the input $E_2$ of the selection circuit L is acted upon by the digital computer R with a control signal $P_1$ equal to zero (logic low), and the input $E_3$ is acted upon with a control signal $P_2$ equal to zero (logic low). As explained previously, the square wave signal S is applied to the input $E_1$. When the control signals $P_1$, $P_2$ are in this logical state, the output signal B of the selection circuit L corresponds to the lower signal level $SU_1$ of the square wave signal $S_1$ (FIG. 5f). The signal $SU_1$ is passed through the low pass filter F, which generates in response thereto a lower signal level $SU_2$ (FIG. 5g) which is digitized by the converter U and is stored by the digital computer R as a binary numerical value N, representative of the lower signal level $SU_1$ of the square wave signal $S_1$.

The computer R is programmed to determine the pulse width repetition ratio TV according to the following formula:

$$TV = (M-N)/(E-M).$$

The computer R is further programmed to display the determined pulse width repetition ratio TV in digital form on the display unit A. In addition, the computer is programmed to repeatedly generate the three combinations of the control signals $P_1$, $P_2$ explained above. In this way, the computer R selectively interrogates the selection circuit L so as to cause the generation in sequence of the signals $S_1$, $SO_1$, and $SU_1$ on the output B of the selection circuit L. These three signals occur sequentially in an arbitrary sequence and are applied to the filter F as explained above. In FIG. 7, the signals $S_1$, $SO_1$, on the output B of the selection circuit L are presented in tabular form as a function of the logical states of the two control signals $P_1$, $P_2$.

The embodiment of FIG. 4 operates to determine the phase angle $\phi$ between two square wave signals $S_V$, $S_R$. The square wave signals $S_V$, $S_R$ are applied to the two inputs of an exclusive OR gate $G'_3$, the output of which is connected with the input $E'_1$ of a digital selection circuit L'. Other circuit elements of FIG. 4 correspond to the associated elements of FIG. 3 and are marked with the same reference symbols, except that the reference symbols of FIG. 4 include a prime.

FIGS. 6a through 6i plot the wave forms of signals generated by the embodiment of FIG. 4 as a function of time t. FIG. 6a represents the square wave signal $S_V$ having a pulse width repetition ratio $TV_V$ equal to $t_{V1}/t_{V2}$. FIG. 6b represents the square wave signal $S_R$ having a pulse width repetition ratio $TV_R$ equal to $t_{R1}/t_{R2}$. The two square wave signals $S_V$, $S_R$ are applied to the inputs of the exclusive OR gate G'₃, the output signal S' of which is shown in FIG. 6c. The two square wave signals $S_V$, $S_R$ are characterized by different pulse width repetition ratios $TV_V$, $TV_R$, but two square wave signals $S_V$, $S_R$ having the same period T.

The square wave signal S' appears on the output B' of the digital selection circuit L' as a square wave signal S'₁ (FIG. 6d) if the control signal P'₁ (which is applied to the input E'₂ of the digital selection circuit L') is in the logic low state and the control signal P'₂ (which is applied to the input E'₃) is in the logic high state. As explained previously, the control signals P'₁, P'₂ are generated by the digital computer R'. The low pass filter F' forms a time integral, arithmetic mean value S'₂ (FIG. 6e) from the square wave signal S'₁. This mean value S'₂ is digitized by the converter U' and is stored by the digital computer R' as a binary numerical value M', which corresponds to the time integral, arithmetic mean value S'₂.

For the determination of the upper signal level SO'₁ of the square wave signal S'₁, the input E'₂ of the digital selection circuit L' is acted upon by the digital computer R' with a control signal P'₁ set to logic high, and the input E'₃ is acted upon with a control signal P'₂ set to logic high. As previously explained, the square wave signal S' is simultaneously applied to the input E'₁. When the control signals P'₁, P'₂ are in the logical states indicated above, the output B' of the digital selection circuit L' carries a signal which corresponds to the upper signal level SO'₁ of the square wave signal S'₁ (FIG. 6f). This signal SO'₁ is applied to the low pass filter F', the output of which corresponds to the upper level SO'₂ (FIG. 6g) which is digitized by the converter U' and is stored by the digital computer R' as a binary numerical value E', representative of the upper signal SO'₁ of the square wave signal S'₁.

For the determination of the lower signal level SU'₁ of the square S'₁, The input E'₂ of the digital selection circuit L' is acted upon by the digital computer R' with a control signal P'₁ set to logic low, and the input E'₃ is acted upon with a control signal P'₂ set to logic low, while the square wave signal S' is applied to the input E'₁. Under these circumstances, the output signal B' of the digital selection circuit L' corresponds to the lower signal level SU'₁ of the square wave signal S'₁ (FIG. 6h). This signal SU'₁ is passed through the low pass filter F' to generate lower signal level SU'₂ which is digitized by the converter U' and is stored by the digital computer R' as a binary numerical value N', which corresponds to the lower signal level SU'₁ of the square wave signal S'₁.

The phase angle $\phi$ between the square wave signals $S_V$, $S_R$ is calculated by the digital computer R' according to the following formula:

$$\phi = \pi(M' - N')/(E' - N')$$

The calculated phase angle is displayed in digital form by the computer by means of the display unit A'. The computer R' is also programmed to generate the three combinations of the control signals P'₁, P'₂ discussed above. Thus, the computer R' operates to interrogate the selection circuit L' such that the signals S'₁, SO'₁, and SU'₁ are generated on the output B' of the selection circuit L' sequentially and in an arbitrary sequence. FIG. 8 represents in tabular form the signals S'₁, SO'₁, and SU'₁ on the output B' of the selection circuit L' as a function of the states of the two control signals P'₁, and P'₂.

Figure 9:
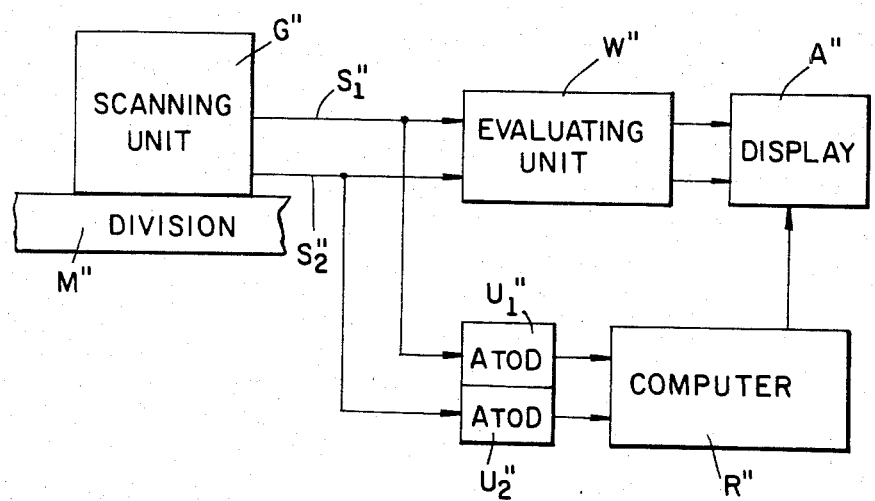
FIG. 9 is a block diagram of a measuring system suitable for use with this invention.

The influence of the residual ripple at the output of the low pass filter F, F' can be decreased by repeated determination of the numerical values M, M', and further averaging by the digital computer R, R'. The method and apparatus of this invention are preferably used in conjunction with an electronic position measuring device (FIG. 9) of the type which incorporates a division which is scanned by a scanning unit mounted to move along the division. The scanning unit operates to generate analog scanning signals $S_1''$, $S_2''$ as a function of the position of the scanning unit with respect to the division. These scanning signals $S_1''$, $S_1''$ are supplied to an evaluating display unit W'', A'' for display of the values of the full signal periods. In order to provide sub-period interpolation, at least one of the analog scanning signals is digitized by means of an analog to digital converter $U_1''$, $U_2''$, and the digital values thereby obtained are supplied to a digital computer R'' for the calculation of sub-period interpolation values. Such a device is described, for example, in West German OS No. 27 29 697. Such a device can be improved by combining it with the preferred embodiments described above to provide correction of the digitized scanning signal prior to interpolation. In order to accomplish this result, the computer is programmed to utilize the signal parameters generated as described above to determine correction values which are stored and automatically utilized by the digital computer in order to improve the accuracy of the interpolation. For example, the foregoing apparatus for measuring phase angle can be used to correct the interpolation in situations where the phase angle between two scanning signals differs from the desired value.

Of course, it should be understood that various changes and modifications to the preferred embodiments described above will be apparent to those skilled in the art. It is, therefore intended that the foregoing detailed description be regarded as illustrative rather than as limiting, and that it be understood that it is the following claims, including all equivalents, which are intended to define the scope of this invention.

I claim:

1. An apparatus for determining at least a signal parameter of at least one square wave signal having an upper voltage level and a lower voltage level, said apparatus comprising:

means, responsive to the at least one square wave signal, for generating a time integral, arithmetic mean, analog signal, the value of which corresponds to the signal parameter, said means for generating the analog signal having an upper limit frequency less than the frequency of the square wave signal;

means, responsive to the analog signal, for generating a first digital signal which corresponds to the analog signal;

a digital computer;

means for supplying the first digital signal to the computer; and means, included in the computer, for determining the signal parameter in response to the first digital signal.

2. The apparatus of claim 1 further comprising:

means for generating a second digital signal representative of the upper voltage level of the square wave signal;

means for generating a third digital signal representative of the lower voltage level of the square wave signal; and means, included in the computer, for automatically determining the signal parameter in response to the second and third digital signals.

3. An apparatus for determining at least a signal parameter of at least a first square wave signal, said apparatus comprising:

a digital selection circuit having a first input terminal coupled to receive the first square wave signal, a set of at least one control signal input terminal, and an output terminal which supplies an output signal;

means, coupled to the output terminal, for generating a time integral analog signal in response to the output signal;

means, responsive to the analog signal, for generating a digital signal representative of the analog signal;

a digital computer;

means for supplying the digital signal to the computer;

means, included in the computer, for generating at least one control signal applied to the set of at least one control signal input terminal;

means, included in the digital selection circuit, for setting the output signal to a second square wave signal corresponding to the first square wave signal in response to a first logical state of the at least one control signal such that the associated digital signal is generatd at a first value representative of an arithmetic mean value of the square wave signal, said second square wave signal having an upper voltage level and a lower voltage level;

means, included in the digital selection circuit, for setting the output signal to correspond to the upper voltage level in response to a second logical state of the at least one control signal such that the associated digital signal is generated at a second value representative of the upper voltage level;

means, included in the digital selection circuit, for setting the output signal to correspond to the lower voltage level in response to a third logical state of the at least one control signal such that the associated digital signal is generated at a third value representative of the lower voltage level; and means, included in the computer, for determining the signal parameter as a function of the first, second, and third values of the digital signal.

4. The apparatus of claim 3 wherein the signal parameter corresponds to the pulse width repetition ratio and the determining means determines the signal parameter as a function of the quotient of (1) the difference between the first value and the third value and (2) the difference between the second value and the first value of the digital signal.

5. The apparatus of claim 3 wherein the signal parameter corresponds to phase angle and the determining means determines the signal parameter as a function of the product of the constant $\pi$ with the quotient of (1) the difference between the first value and the third value and (2) the difference between the second value and the third value of the digital signal.

6. The apparatus of claim 1 or 2 or 3 or 4 further comprising:

a display unit coupled to the computer; and means, included in the computer, for controlling the display unit to display the signal parameter.

7. The apparatus of claim 1 or 3 wherein the computer further comprises:

means, included in the computer, for causing the determining means to determine the signal parameter repeatedly in response to changing values of the digital signal.

8. The apparatus of claim 3 wherein the means for generating a time integral analog signal comprises a low pass filter having a limit frequency lower than the frequency of the square wave signal.

9. The apparatus of claim 3 wherein the digital selection circuit comprises:

a first gate having a first input coupled to the first input terminal of the selection circuit, a second input coupled to a first one of the set of control signal input terminals, and an output; and a second gate having a first input coupled to the output of the first gate and a second input coupled to a second one of the set of control signal input terminals.

10. The apparatus of claim 9 wherein the first gate comprises an OR gate and the second gate comprises an AND gate.

11. The apparatus of claim 3 further comprising:

a logical gate having an input coupled to receive the first square wave signal and an output coupled to the input terminal of the digital selection circuit.

12. The apparatus of claim 11 wherein the logical gate comprises an exclusive OR gate.

13. The apparatus of claim 1 or 3 in combination with a digital position measuring system of the type having means for generating at least one electronic, analog scanning signal; means, responsive to the scanning signal, for evaluating and displaying a measure of position, said evaluating means comprising means for digitizing the scanning signal and means for generating interpolation values in response to the digitized scanning signal; wherein means are provided for correcting the digitized scanning signal as a function of the signal parameter determined by the determining means.

* * * * *

UNITED STATES PATENT AND TRADEMARK OFFICE
CERTIFICATE OF CORRECTION

PATENT NO. : 4,534,004
DATED : August 6, 1985
INVENTOR(S) : Norbert Vollmayr

It is certified that error appears in the above-identified patent and that said Letters Patent is hereby corrected as shown below:

IN THE SUMMARY OF THE INVENTION

In column 1, line 62, please delete "section" and substitute therefor --selection--.

IN THE DETAILED DESCRIPTION OF THE PRESENTLY PREFERRED EMBODIMENTS

In column 3, line 11, after "repetition" please insert --ratio--;

In column 3, line 58, please delete "logical" and substitute therefor --logic--;

In column 4, line 16, after "$S_1$" please insert: --(Figure 5d). The signal $SO_1$ is applied to the low pass filter F causing the filter to generate an upper signal level $SO_2$ (Figure 5e) which is digitized by the converter U and is stored by the digital computer R as a binary numerical value E, which corresponds to the upper signal level $SO_1$ of the square wave signal $S_1$--;

UNITED STATES PATENT AND TRADEMARK OFFICE
CERTIFICATE OF CORRECTION

PATENT NO. : 4,534,004
DATED : August 6, 1985
INVENTOR(S) : Norbert Vollmayr

It is certified that error appears in the above-identified patent and that said Letters Patent is hereby corrected as shown below:

In column 4, line 50, after "$SO_1$," please insert --$SU_1$--;

In column 5, line 5, please delete "having" and substitute therefor --have--;

In column 5, line 33, before "level" please insert --signal--;

In column 5, line 38, after "square" please insert --wave signal--;

In column 5, line 38, please delete "The" and substitute therefor --the--;

In column 6, line 12, please delete "$S_1$"" (second occurrence) and substitute therefor --$S_2$"--;

In column 6, line 13, please delete "evaluating display" and substitute therefor --evaluating/display--.

UNITED STATES PATENT AND TRADEMARK OFFICE
CERTIFICATE OF CORRECTION

PATENT NO. : 4,534,004

DATED : August 6, 1985

INVENTOR(S) : Norbert Vollmayr

It is certified that error appears in the above-identified patent and that said Letters Patent is hereby corrected as shown below:

IN THE CLAIMS

In claim 3 (column 7, line 31), please delete "generatd" and substitute therefor --generated--.

Signed and Sealed this

Third Day of May, 1988

Attest:

DONALD J. QUIGG

Attesting Officer

Commissioner of Patents and Trademarks